United States Patent [19]

Admiraal et al.

[11] Patent Number: 4,525,856
[45] Date of Patent: Jun. 25, 1985

[54] AMPLIFIER ARRANGEMENT FOR ACOUSTIC SIGNALS, PROVIDED WITH MEANS FOR SUPPRESSING (UNDERSIRED) SPURIOUS SIGNALS

[75] Inventors: Daniël J. H. Admiraal, Lieshout; Benjamin Lopes Cardozo, Eindhoven, both of Netherlands

[73] Assignee: U.S. Philips Corporation, New York, N.Y.

[21] Appl. No.: 6,144

[22] Filed: Jan. 24, 1979

Related U.S. Application Data

[63] Continuation of Ser. No. 847,042, Oct. 31, 1977, abandoned.

[30] Foreign Application Priority Data

Nov. 8, 1976 [NL] Netherlands ......................... 7612358

[51] Int. Cl.³ .......................... H04M 1/20; H04R 3/02
[52] U.S. Cl. ....................................... 381/93; 381/83; 381/121
[58] Field of Search ............... 179/1 AT, 1 FS, 1 HF, 179/1 P, 1 SC, 107 FD; 330/149; 324/78 D, 78 J; 381/71, 77, 82, 83, 93, 94, 121

[56] References Cited

U.S. PATENT DOCUMENTS 3,405,237  10/1968  David, Jr. et al. ............... 179/1 SC
3,920,931  11/1975  Yanick, Jr. ..................... 179/107 FD
4,079,199   3/1978  Patronis, Jr. ..................... 179/1 FS Primary Examiner—Gene Z. Rubinson
Assistant Examiner—Randall P. Myers
Attorney, Agent, or Firm—Robert T. Mayer; Bernard Franzblau

[57] ABSTRACT

An amplifier for acoustic signals provided with means for suppressing undersired acoustic feedback signals in a rapid manner. The amplifier includes a high-pass filter which separates a part of the signal to be amplified to obtain a control signal for reducing the gain of the amplifier when an acoustic feedback signal is detected. The output of the high-pass filter is connected to a periodicity detector, e.g. a single peak detector, which discriminates between an acoustic feedback signal having a regular periodicity and a signal having an irregular character, such as noise or speech. The control signal is derived from the output of the periodicity detector.

8 Claims, 1 Drawing Figure

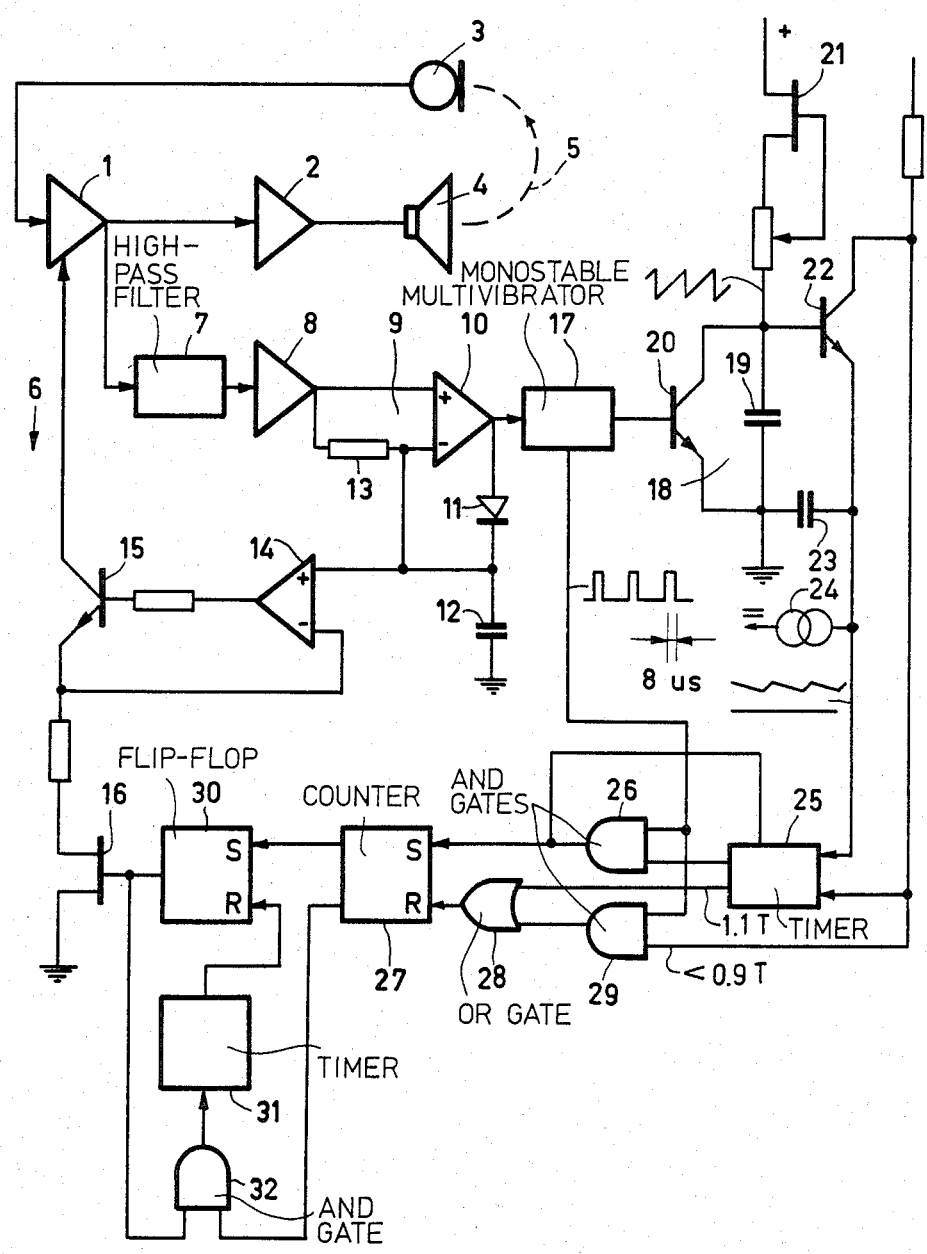

AMPLIFIER ARRANGEMENT FOR ACOUSTIC SIGNALS, PROVIDED WITH MEANS FOR SUPPRESSING (UNDERSIRED) SPURIOUS SIGNALS

This is a continuation, of application Ser. No. 847,042, filed Oct. 31, 1977 abandoned.

The invention relates to an amplifier arrangement for acoustic signals provided with means for suppressing (undesired) spurious signals and comprising a high-pass filter which separates a part of the signal to be amplified so as to obtain a control signal by means of which the gain of the arrangement is reduced.

Such an amplifier arrangement, which is intended for recording speech signals, is known from British Pat. No. 1,228,795. Since hissing sounds in speech signals are undesirable this arrangement is provided with a discriminator which, upon the occurrence of such hissing sounds, supplies a gain-reduction signal to the output amplifier so that the hissing sounds are eliminated.

For this purpose the discriminator comprises a high-pass filter whose cut-off frequency is 6000 Hz.

It is an object of the invention to suppress spurious signals produced as a result of acoustic feedback, so-called acoustic-feedback signals.

Such an acoustic feedback signal may occur at different frequencies, for example between 800 and 10,000 Hz, depending on the acoustic feedback path traversed by the signal. If said known arrangement is also used for the suppression of acoustic feedback by lowering the cut-off frequency of the high-pass filter, this is found to be possible in practice but not without a loss of timbre of the sibilants in the acoustic signal to be amplified.

If acoustic feedback is caused by such a sibilant, the gain will be reduced for the entire length of said sibilant. When the sibilant, for example, occurs in the word "Scheveningen" this length is more than 600 msecs. It is evident that in such a case the timbre of the acoustic signal to be amplified is considerably affected.

It is an object of the invention to minimize acoustic feedback by, means of a very fast control system which does not affect the timbre of the signal, in such a way that the acoustic feedback wave remains below a specific loudness level, i.e. that said feedback is not experienced as annoying by the audience or is not even perceived at all.

For this purpose the invention is characterized in that the output of the high-pass filter is connected to a periodicity detector which discriminates between signals with a regular periodicity and those with an irregular character, such as noise or speech, said control signal being derived from the output of the periodicity detector.

A periodicity detector, as for example described in I.P.O. Annual Progress Report, No. 5, 1970, pages 188-197, is used for speech analysis and can discriminate significant periodic signals from irregular signals in a very rapid manner - of the order of magnitude of few milliseconds.

The invention is based on the recognition that such a periodicity detector is extremely suitable for determining whether an electroacoustic amplifier system exhibits a tendency to produce acoustic feedback.

Such a detector enables the control system to act so fast that a further build-up of an acoustic feedback wave is prevented and the timbre of the signal to be amplified is not affected.

In contradistinction to what can be achieved by the known arrangement in accordance with the cited British Patent Specification, the control system in the arrangement in accordance with the invention only responds if there is a tendency towards acoustic feedback, whereas in the first-mentioned arrangement any excess production of treble tones leads to a reduction of the gain.

The above-mentioned known periodicity detector is equipped with two peak detector circuits which have time constants which differ substantially from each other. They operate alternately by means of a logic circuit, a single frequency being identifiable with an accuracy of 10%. This identification is the effected after measuring only 2 regularly succeeding periods, but practice has shown that for a reliable measurement of an acoustic-feedback signal this number should preferably be increased to 5 periods.

As said periodicity detector is suitable for a frequency range from 800 Hz to 4000 Hz the time required for this measurement is less than 6 milliseconds.

As the gain-reduction time of the amplifier can also be very small, for example 2 milliseconds, the amplifier arrangement in accordance with the invention has the advantage that the occurrence of acoustic feedback can be limited to less than 0.1 sec. This time is too short for the acoustic-feedback effect to assume annoying proportions.

When acoustic feedback starts the electroacoustic amplifier arrangement begins to function as an oscillator.

The acoustic feedback wave then exhibits a progressively increasing amplitude.

In accordance with a preferred embodiment of the invention the periodicity detector comprises a single peak detector whose time constant substantially corresponds to that of the cut-off frequency of the high-pass filter. The peak detector supplies to a logic circuit a number of pulses whose position corresponds to that of the peaks of the acoustic feedback signal. The logic circuit comprises a number of time gates. As a result pulses which are spaced at substantially equal time intervals are transferred to a counting device which, upon receipt of at least four of these pulses, actuates a switch in a control circuit, so that said control signal is applied to the amplifier arrangement.

The amplifier arrangement in accordance with the invention is suitable for sound reinforcement in halls as well as for public address installations, free hands talking telephones and hearing aids.

For amplifier systems in a hall the microphone and loudspeaker generally have a fixed location in the hall. The acoustic properties of the acoustic feedback path between the loudspeaker and microphone are then substantially constant. Acoustic feedback then generally occurs at one frequency, which is usually approx. 2000 Hz.

Particularly satisfactory results have been obtained with the so-called compact hearing aids or listening amplifiers in which the microphone and amplifier are accommodated in the shell of an ear phone. This device is held against the ear when desired.

When the device is withdrawn from the ear acoustic feedback occurs, every movement of the device causing the acoustic feedback path to change so that variations in acoustic feedback frequency are obtained which may even exceed a factor of 5.

However, the frequency jumps do not present any problem because in this case the search time for the periodicity is bridged by a timer. Between the counter and the switch a time delay circuit is then included whose delay is several times greater than the minimum time required to set the counter to its final count. As a result after a periodic acoustic feedback signal has terminated the switch remains closed for the duration of this delay.

The invention will now be described in more detail with reference to the accompanying drawing.

The drawing schematically shows an amplifier arrangement in accordance with the invention. The amplifier arrangement in part of a so-called compact hearing aid and comprises a preamplifier 1 and an output amplifier 2, which may form one unit. A microphone 3 is connected to the input of the amplifier 1 and a loudspeaker 4 is connected to the output of output amplifier 2.

The dashed line 5 represents the acoustic feedback path between the loudspeaker 4 and the microphone 3.

In the case of acoustic feedback the gain of the preamplifier 1 is reduced by the control circuit 6 which is connected thereto.

A part of the output signal of preamplifier 1 is filtered by a high-pass filter 7, the cut-off frequency of said filter being 800 Hz. Subsequently this signal is slightly amplified by amplifier 8 and fed to the peak detector circuit 9.

This peak detector circuit comprises the operational amplifier 10, diode 11, capacitor 12 and resistor 13. Diode 11 ensures that the capacitor 12 is charged instantaneously to the peak value of any signal peak at the + input of operational amplifier 10. Subsequently, capacitor 12 is gradually discharged through resistor 13. The RC product of capacitor 12 and resistor 13, i.e. the time constant of the peak detector circuit, is for example 1.2 msec.

The detected voltage across capacitor 12 is subsequently applied to transistor 15 via a voltage follower 14. The transistor 15 forms part of a control circuit 6 and supplies the gain-reduction current to the preamplifier 1.

However, this feedback control does not happen until periodicity of the acoustic feedback signal has actually been detected. At that instant a switch 16 becomes conductive. This switch consists of a field-effect transistor and forms part of the control circuit 6.

The periodicity of the acoustic feedback signal is detected as follows.

The operational amplifier 10 is followed by a monostable multivibrator 17. For each signal peak which is detected the diode 11 is turned off and a voltage transient appears at the output of the operational amplifier 10, by means of which the monostable multivibrator 17 is triggered. Said multivibrator supplies pulses of width of for example 8 μsecs, which in the case of a noise-like input signal are irregularly spaced in time and in the case of a periodic input signal are regularly spaced in time.

The function of the periodicity detector is to establish this difference and transfer it to a counter.

The 8 μsec. pulses are converted into a sawtooth voltage by means of a device 18, the duration of the pulses being sufficiently long to allow capacitor 19 of the device 18 to be discharged completely via transistor 20.

Subsequently capacitor 19 is charged linearly by a constant current source 21 which essentially consists of a field-effect transistor.

The device 18 produces a sawtooth waveform whose consecutive amplitudes differ substantially for noise and are all equal in the case of a periodic signal having a period T.

The criterion now adopted for a periodic signal is that the amplitude of each sawtooth is allowed to deviate approximately 10% from the preceding sawtooth.

In order to detect this the sawtooth waveforms are stored in the sawtooth-envelope capacitor 23 via transistor 22, which capacitor is discharged only slowly by a constant direct current source 24.

This is effected in such a way that in the case of purely periodic pulses with a repetition time T transistor 22 is turned on at the instant that 90% of the time T has elapsed. Thus, from time zero until 0.9T, while capacitor 19 is linearly charging, transistor 22 is cut-off and its collector potential is at the potential of the positive supply voltage. This positive voltage maintains the AND gate 29 open during the aforesaid capacitor charge period. When the capacitor charge voltage equals the voltage on capacitor 23, at the time 0.9T, transistor 22 turns on, its collector voltage drops and thereby closes AND gate 29.

At this instant a timer 25 is triggered, which opens an AND-gate 26. This gate functions as a "time window". Depending on the voltage on the sawtooth-envelope capacitor 23, i.e. on the period T, gate 26 remains open until after a time interval of 1.1T the device 25 automatically resets and AND-gate 26 is closed. Thus, AND gate 26 is opened at the same time that AND gate 29 is closed.

The gate is open for a maximum time of 0.9 to 1.1T, i.e. for a duration of 0.2T. The AND gate 26 is closed for times less than 0.9T and greater than 1.1T.

The AND-gate 26 also receives 8 μsec. pulses from multivibrator 17. If an 8 μsec. pulse appears within the 0.2T time interval, this pulse is transferred by the AND-gate 26 as a so-called "periodic pulse" to the S-input of a 4-counter 27. These pulses are moreover applied to the device 25, which is reset thereby. Between the device 25 and counter 27 the OR-gate 28 and the AND-gate 29 are included which ensure that the counter 27 is reset when (a) a premature 8 μsec. pulse would appear within the time interval 0–0.9T and (b) no 8 μsec. pulse will appear within the time interval (0.9–1.1)T. In case (b) the device 25 is automatically reset, and AND-gate 26, i.e. the time window, is closed.

In practice it is found that for an unambiguous discrimination between a noise-like and a periodic signal, using the above-mentioned criterion of a 10% difference between consecutive periods, 5 periods provide sufficient discrimination so that the use of a 4-counter 27 suffices.

The 10% criterion has been found experimentally as a compromise. At a higher percentage it is found that there is less discrimination between the acoustic feedback signal and a noise or speech signal, whereas for a lower percentage the periodicity detector follows the single periodic frequency in a less satisfactory manner.

The use of 5 periods as criterion has been adopted to ascertain that there is actually a periodic signal during acoustic feedback.

When the final count of counter 27 is reached flip-flop 30 changes over and switches over switch 16 so that the control circuit 6 can supply the gain-reduction current to preamplifier 1 whereby the gain is reduced.

When the counter 27 is set to its intial count, while the flip-flop 30 has changed over, the interlocking of a timer 31 to the input via AND-gate 32 is eliminated as long as the count is smaller than 4.

The device 31 has a built-in delay of approximately 0.5 secs. When the counter 27 reaches its final count within said time, in that again a periodicity is detected in the acoustic feedback signal, the device 31 is prematurely set to the interlocked zero position because the flip-flop 30 has not yet been reset.

Thus, switch 16 in the gain-reduction circuit 6 remains closed.

Once flip-flop 30 has changed over, the device 31 again begins with its delay each time that the counter 27 is reset. In this way different frequency components of the acoustic feedback signal are effectively tracked and the search time for another periodicity is bridged and the gain of the preamplifier 1 remains reduced, despite possible large frequency differences in the acoustic-feedback signal.

If within half a second no new periodicity is detected, because the acoustic feedback ceases, the counter 27 cannot reach its final count and the device 31 can reach its full delay of 0.5 seconds. At this instant flip-flop 30 is reset, which in its turn sets the device 31 to the interlocked zero position. Switch 16 is opened and the gain-reduction current disappears so that the gain of preamplifier 1 becomes maximum again.

Reduction of the gain of the preamplifier can be effected in steps. At the instant that the counter has detected 5 equal periods in the acoustic-feedback signal and switch 16 is consequently closed (FET becomes conductive), the loop gain of the system in the audio path between microphone 3 and loudspeaker 4 can be reduced by for example 10 dB by switching a fixed attenuator in the aforesaid audio path to reduce the loop gain in 10 dB steps. If the periodicity detector then remains operative, i.e. the counter again counts 5 periods, the gain is again reduced by a 10 dB attenuation. This may continue until the acoustic feedback effect is no longer audible. Thus, the term gain also includes signal attenuation.

Subsequently, the gain increases with a time constant of for example 1 minute. It is obvious that the periodicity detector will again become operative at the instant that the acoustic feedback wave exceeds a certain limit.

For acoustic amplifier installations in a hall, the microphone 3 and loudspeaker 4 are generally disposed at fixed locations. This means that the acoustic feedback path is then substantially constant, which in the case of acoustic feedback generally results in fixed single acoustic-feedback frequencies. As in this case no transients occurs in the acoustic feedback frequencies, the time bridging circuit consisting of the device 31 and AND-gate 32 may be dispensed with.

The 4-counter 27 is then directly connected to switch 16 via flip-flop 30.

What is claimed is:

1. An amplifier circuit for acoustic signals comprising, gain controllable amplifier means for said acoustic signals, a control circuit coupled to said amplifier means to derive a first control signal for reducing the gain of the amplifier means in the presence in the amplifier means of an undesired acoustic feedback signal exhibiting a regular periodicity characteristic, a high-pass filter coupled to the amplifier means to receive and separate a part of the signal amplified, and a periodicity detector coupled to the output of the filter and operative to discriminate between an acoustic feedback signal having a regular periodicity and signals having an irregular periodicity characteristic thereby to produce a second control signal for operating the control circuit to derive said first control signal when the periodicity detector detects the presence of said acoustic feedback signal exhibiting said regular periodicity at the output of the filter.

2. An amplifier circuit as claimed in claim 1 wherein the periodicity detector comprises a counter coupled to the control circuit, a single peak detector having a time constant that substantially corresponds to that of the cut-off frequency of the high pass filter, a logic circuit including time gate means, and means coupling the logic circuit to the peak detector whereby the peak detector supplies to the logic circuit a number of pulses corresponding to the peaks of the acoustic feedback signal so that pulses which are spaced at substantially equal time intervals are transferred to the counter which, upon receipt of at least four of said pulses, switches the control circuit so that said first control signal is applied to the amplifier means.

3. An amplifier circuit as claimed in claim 2 wherein the control circuit includes a switch and the periodicity detector further comprises a time delay circuit connected between the counter and switch, the time delay circuit having a delay time several times greater than the minimum time required to set the counter to its final count so that after a periodic acoustic feedback signal has terminated the switch remains closed for the duration of said delay time.

4. An amplifier circuit as claimed in claim 1 wherein the periodicity detector comprises, a peak detector coupled to the output of the filter, a counter for controlling the operation of the control circuit, means coupled to the output of the peak detector for generating a periodic signal whose amplitude is determined by the periodicity of a signal applied thereto and also pulse signals in correspondence with the peaks of said applied signal, and a logic circuit coupled between the output of the signal generating mens and the input of the counter and controlled by said periodic signal and said pulse signals so that only equally spaced pulse signals are transferred to the counter which thereby derives said second control signal upon receipt of a predetermined number of said pulse signals.

5. An electroacoustic amplifier circuit for suppressing undesired acoustic feedback signals which exhibit a regular periodicity comprising, a first transducer for converting acoustic energy into electric signals, a second transducer for converting electric signals into acoustic energy, a gain controlled amplifier means coupled between said first and second transducers, a control circuit for varying the gain of said amplifier means upon receipt by the amplifier means of said acoustic feedback signal, a highpass filter coupled to the amplifier means, and a periodicity detector coupled between the filter output and the control circuit input and including means to discriminate between an acoustic feedback signal exhibiting said regular periodicity and other signals having an irregular periodicity thereby to operate said control circuit to vary the amplifier gain only when an acoustic feedback signal exhibiting said regular periodicity is present at the filter output.

6. An electroacoustic amplifier circuit as claimed in claim 5 wherein the periodicity detector comprises, a counter connected to control the control circuit, a peak detector coupled to the filter output, a pulse generator responsive to the peak detector to produce a sequence of pulses in correspondence with the peaks of a signal applied to the peak detector thereby to derive a sequence of regularly recurrent pulses in response to an acoustic feedback signal with a regular periodicity, and a logic circuit coupled between the pulse generator output and the counter input whereby only a sequence of regularly recurrent pulses pass through the logic circuit to the counter, the counter producing an output signal for the control circuit upon receipt of a predetermined number of said recurrent pulses.

7. An electroacoustic amplifier circuit as claimed in claim 5 wherein the control circuit includes a switching device controlled by the output of the periodicity detector and switchable between a first state in which the amplifier gain is varied by the control circuit and a second state in which the control circuit is effectively inoperative to control the amplifier gain.

8. An electroacoustic amplifier circuit as claimed in claim 5 wherein the periodicity detector comprises, peak detector means for generating a pulse signal for each signal peak in a signal appearing at the filter output, and means responsive to said pulse signals for discriminating between regularly recurrent pulse signals and irregular pulse signals to derive a control signal for the control circuit that causes the control circuit to vary the amplifier gain only upon receipt of at least four regularly recurrent pulse signals by said pulse signal discriminating means.

* * * * *